United States Patent
Morita

[11] Patent Number: 5,992,013
[45] Date of Patent: Nov. 30, 1999

[54] APPARATUS AND A METHOD OF MOUNTING ELECTRONIC COMPONENTS

[75] Inventor: Takeshi Morita, Chikushino, Japan

[73] Assignee: Matsushita Electric Industrial Co., Ltd., Osaka, Japan

[21] Appl. No.: 09/196,164

[22] Filed: Nov. 20, 1998

[30] Foreign Application Priority Data

Nov. 21, 1997 [JP] Japan ................................ 9-320935

[51] Int. Cl.⁶ .................................................. H05K 3/30
[52] U.S. Cl. ............................. 29/833; 29/712; 29/720; 29/832
[58] Field of Search .......................... 29/712, 720, 721, 29/740, 832, 833

[56] References Cited

U.S. PATENT DOCUMENTS

| | | | |
|---|---|---|---|
| 4,546,443 | 10/1985 | Oguchi et al. | 364/513 |
| 4,608,494 | 8/1986 | Kobayashi et al. | 250/461.1 |
| 4,683,644 | 8/1987 | Tange et al. | 437/7 |
| 5,010,474 | 4/1991 | Tsuruta et al. | 364/167.01 |
| 5,075,559 | 12/1991 | Amir | 250/560 |
| 5,214,841 | 6/1993 | Howard et al. | 29/721 |
| 5,265,330 | 11/1993 | Sakaguchi | 29/836 |
| 5,383,270 | 1/1995 | Iwatsuka et al. | 29/840 |
| 5,547,537 | 8/1996 | Reynolds et al. | 156/351 |

*Primary Examiner*—Lee Young
*Assistant Examiner*—Kevin G Vereene
*Attorney, Agent, or Firm*—Wenderoth, Lind & Ponack, L.L.P.

[57] ABSTRACT

An apparatus and method for mounting electronic components in which mounting positions are determined by observing identification marks A, B, C and D on a substrate with a camera. The electronic components are mounted on the substrate by correcting programmed data according to the result of the determination of the mounting positions. Correction values are obtained for coordinates of the mounting position with reference to each of a plurality of combinations of any three positions (e.g. A, B and C) selected among the at least four positions of the identification marks A, B, C and D based on coordinate data of the three selected positions before and after deformation (one based on the design data and the other based on the data determined during mounting process). A correction of the programmed data for coordinates of the mounting position is made using a positional correction value, which is a mean value of the correction values.

11 Claims, 5 Drawing Sheets

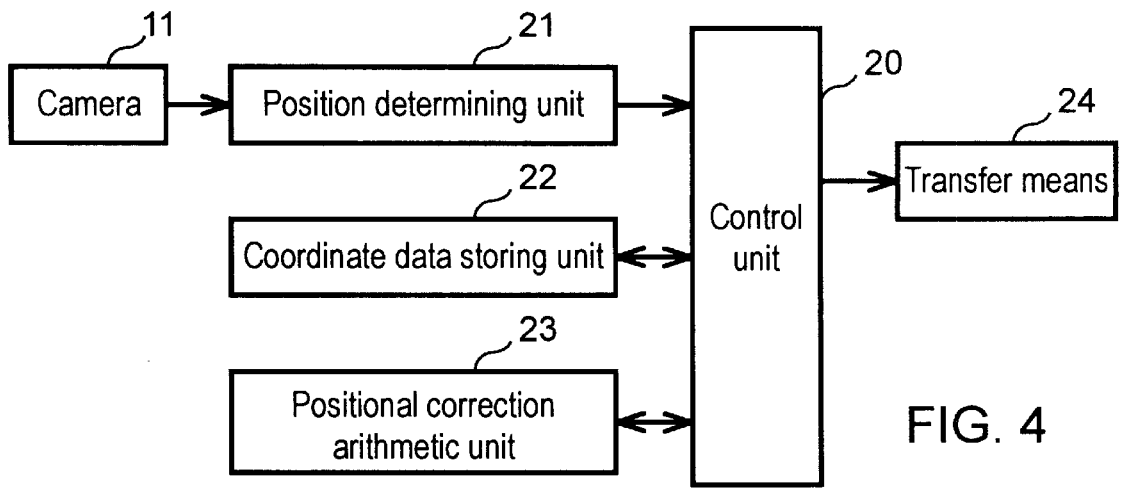
FIG. 4
FIG. 5
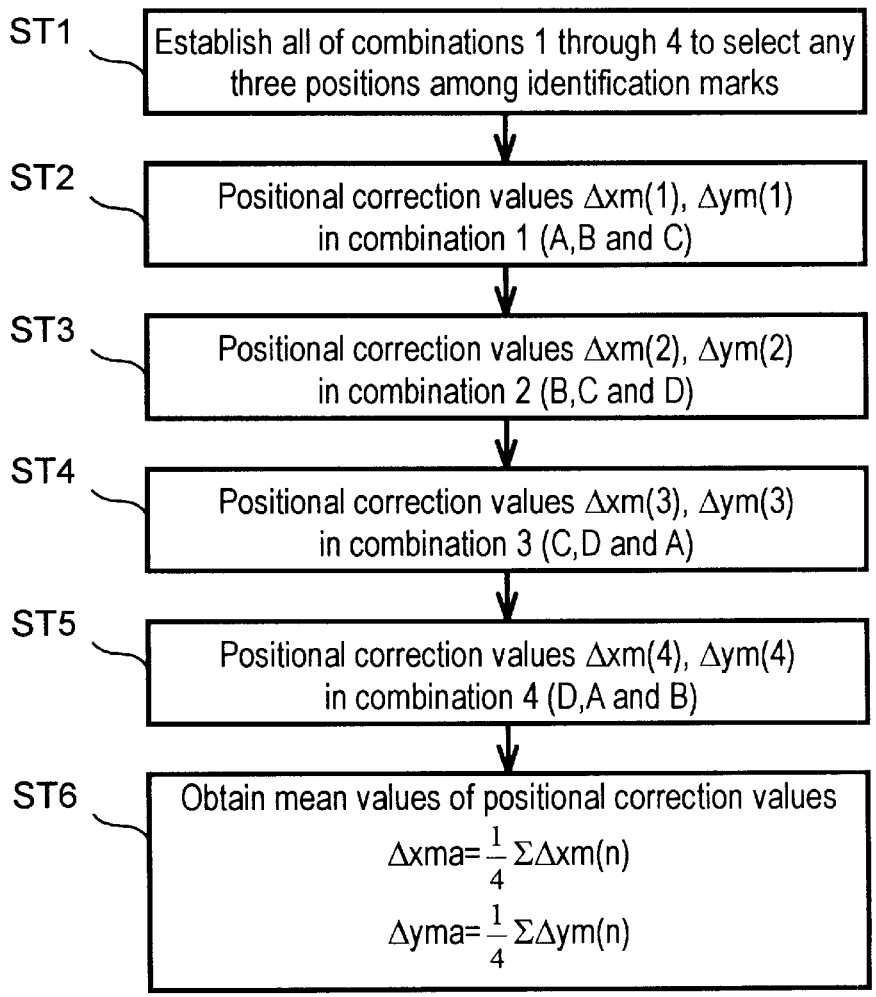

FIG. 6

| Mounting position | Programmed data of coordinate | Positional correction values |
|---|---|---|
| M1 | xm1, ym1 | Δxm1, Δym1 |
| M2 | xm2, ym2 | Δxm2, Δym2 |
|  |  |  |
|  |  |  |
|  |  |  |
| Mn | xmn, ymn | Δxmn, Δymn |
|  |  |  |

5,992,013

APPARATUS AND A METHOD OF MOUNTING ELECTRONIC COMPONENTS

FIELD OF THE INVENTION

The present invention relates to an apparatus for mounting electronic components on a substrate and a method of mounting the same.

BACKGROUND OF THE INVENTION

A substrate on which electronic components are mounted deforms due to heat and load applied during a manufacturing process, and the substrate does not necessarily maintain a shape according to design dimensions at a time the electronic components are mounted. For this reason, apparatuses for mounting electronic components are designed to make a positional correction of a mounting position for each of the electronic components on the substrate by detecting an identification mark that is originally formed on the substrate for positional identification. In the past, according to one known method, two or three identification marks are placed on the substrate, and they are observed by a camera in order to determine mounting positions.

The method of observing two positions is effective only for a deformation of the substrate that expands or contracts uniformly both in length and width. The method of observing three positions, on the other hand, resolves the above shortcoming and is effective even if the substrate is deformed in different ratios of expansion and contraction between the length and the width. However, all of the above-described deformations are limited to a case in which a rectangular substrate maintains its rectangular shape even after deformation. Therefore, the method of observing three positions is unable to provide, with a required accuracy, for an ordinary irregular deformation in which a ratio of expansion and contraction of the substrate is not uniform and is different in part, for example in cases where the deformation is from a rectangular shape to a trapezoidal shape. Thus, there exists a problem with the prior art apparatuses in that they are unable to make a positional correction using the positional identification marks when mounting electronic components, in the case where the substrate is deformed in an irregular manner.

SUMMARY OF THE INVENTION

An object of the present invention is to provide an apparatus for mounting electronic components that is capable of making a positional correction using the positional identification marks when mounting electronic components even on an irregularly deformed substrate, and a method of achieving the same.

In the apparatus and method for mounting electronic components of the present invention a mounting position is determined by observing identification marks formed on at least four positions of the substrate with a camera, and electronic components are mounted on the substrate with a transfer means after making a correction of programmed data for coordinates of a mounting position based on a result of the determination. The apparatus derives correction values for coordinates of the mounting position with reference to each of a plurality of combinations of any three positions selected among those of at least four identification marks, based on the coordinate data of these three positions. The transfer means is controlled by correcting the programmed data for coordinates of the mounting position using a practical positional correction value, which is a mean value of the derived correction values. Accordingly, the present invention is able to accurately make a correction of the mounting position during the mounting process even if the substrate has a complicated deformation.

BRIEF DESCRIPTION OF THE DRAWINGS

FIG. 4 is a block diagram showing a control system structure of the apparatus for mounting electronic components of the exemplary embodiment of the present invention;

FIG. 5 is a flowchart for an arithmetic computation of a positional correction value in the apparatus for mounting electronic components of the exemplary embodiment of the present invention; and FIG. 6 is a table showing a programmed data of the apparatus for mounting electronic components of the exemplary embodiment of the present invention.

DESCRIPTION OF THE PREFERRED EMBODIMENT

Figure 1:
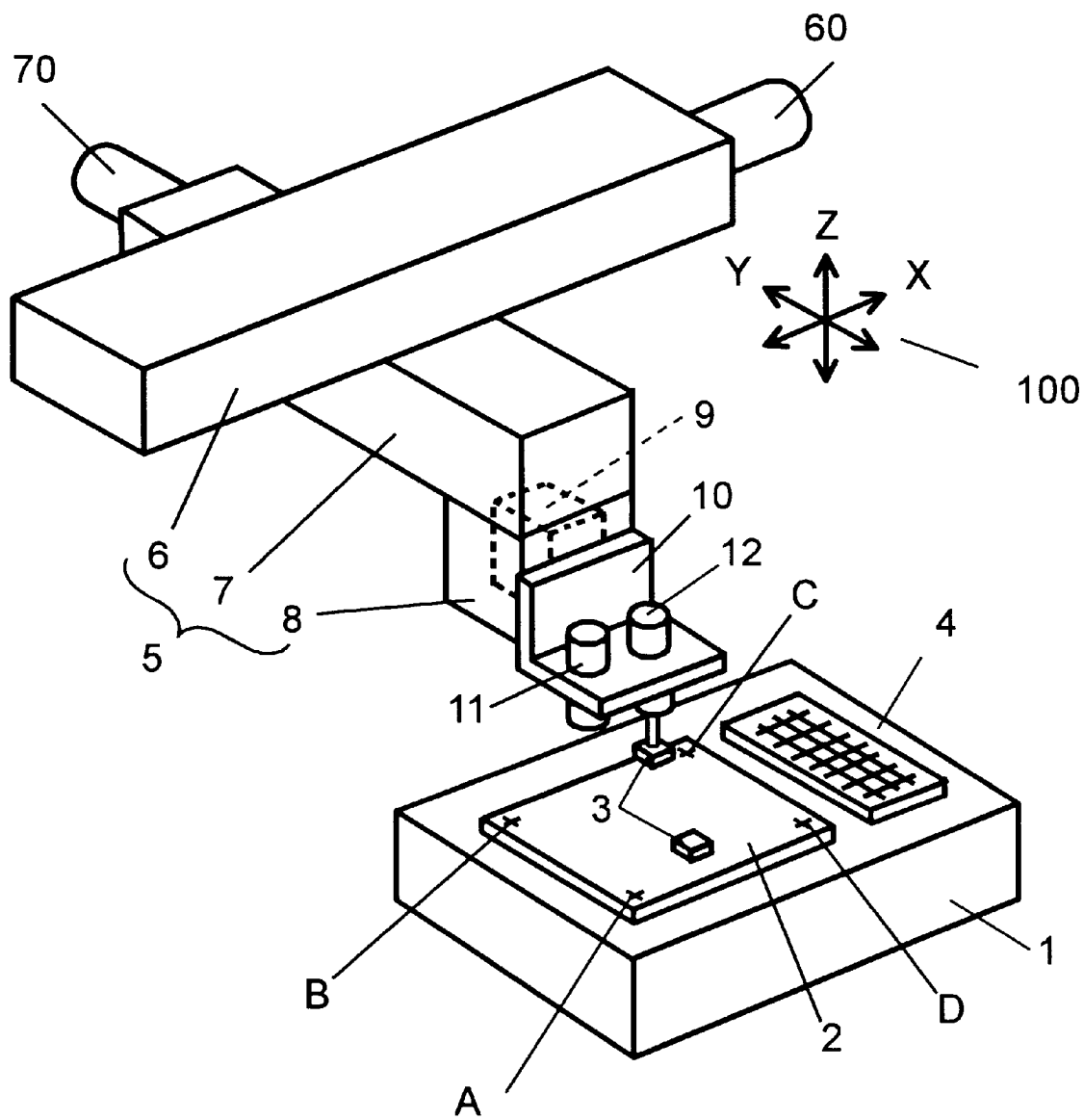
FIG. 1 is a perspective view of an apparatus for mounting electronic components of an exemplary embodiment of the present invention.

The apparatus for mounting electronic components is now described by referring to FIG. 1. In FIG. 1, a substrate 2 is placed on a table 1. Electronic components 3 are to be mounted on the substrate 2. At a side of the substrate 2 on the table 1, a supply unit 4 of the electronic components 3 is provided.

A moving table 5 is provided above the table 1. The moving table 5 comprises an X table 6 equipped with an X axis motor 60, a Y table 7 equipped with a Y axis motor 70, and a Z table 8 attached to the Y table 7. The Z table 8 is provided with a mounting head 10. The mounting head 10 moves horizontally in both an X direction and a Y direction above the table 1 when the X table 6 and the Y table 7 are driven. The mounting head 10 also moves vertically in a Z direction above the table 1 when a vertical moving means 9 of the Z table 8 is driven. Three arrows 100 in FIG. 1 show the moving direction X of the X table 6, the moving direction Y of the Y table 7, and the moving direction Z of the mounting head 10.

The mounting head 10 is equipped with a camera 11 and a transfer head 12. The camera 11 observes four identification marks A, B, C and D formed on an upper surface of the substrate 2 for positional determination. The transfer head 12 is mounted next to the camera 11. The transfer head 12 moves both horizontally and vertically above the table 1 as the moving table 5 is driven, and mounts an electronic component 3 at a predetermined position on the substrate 2 after picking it up from the supply unit 4. Therefore, the moving table 5 and the transfer head 12 constitute a transfer means for transferring the electronic component 3 to the substrate 2.

Figure 2A:
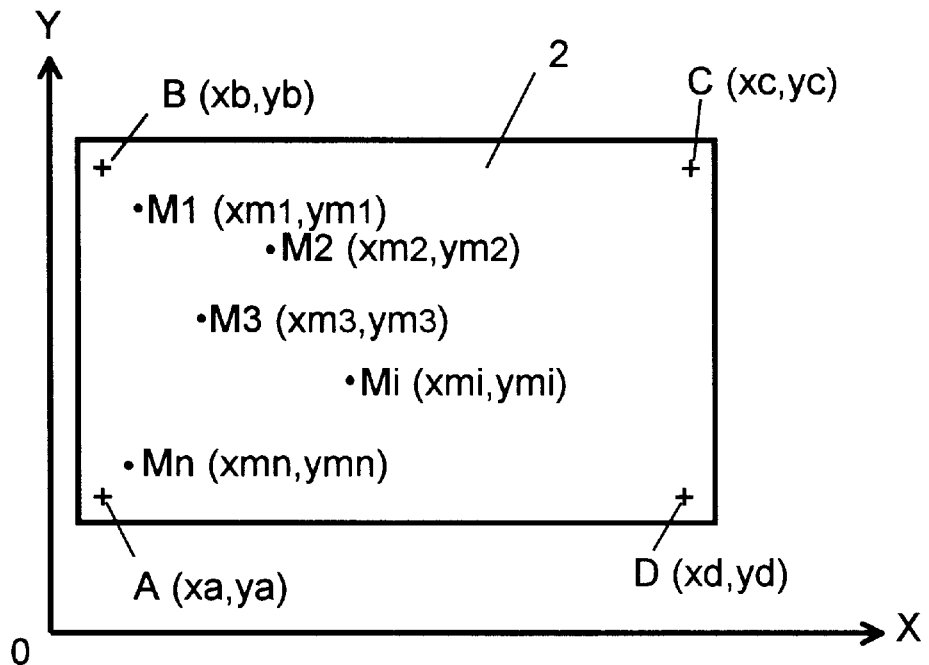
FIG. 2A is a plan view of a rectangular substrate on which electronic components are mounted by the apparatus for mounting electronic components of the exemplary embodiment of the present invention.

The substrate 2 will now be described with reference to FIG. 2A and FIG. 2B. FIG. 2A shows the substrate 2 that is free of deformation, having dimensions exactly according to the design. Each corner of the substrate 2 is formed with the four identification marks A, B, C and D. Alphabetic ideograms in parentheses such as (xa, ya) etc. indicate an X coordinate value and a Y coordinate value for each position of the identification marks for use in programming data. Also, on the substrate 2, a total "n" of mounting positions Mi (i=1, 2, - - -, n) is provided for mounting electronic components 3. The alphabetic ideograms in parentheses such as (xmi, ymi) etc. indicate an X coordinate value and a Y coordinate value of each mounting position for use in the programming data.

Figure 2B:
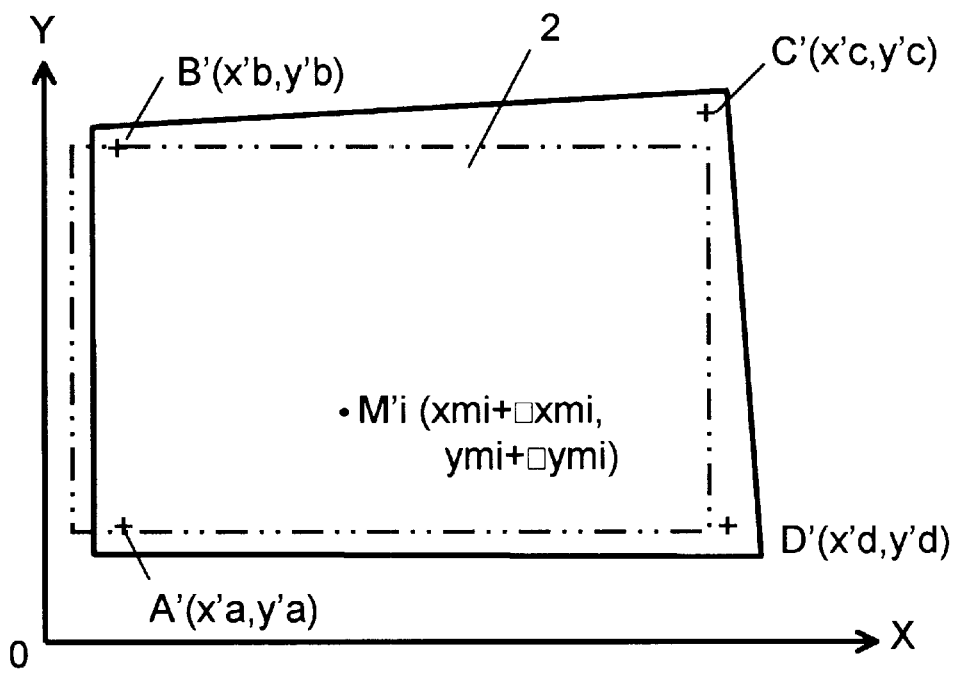
FIG. 2B is a plan view of a rectangular substrate, after being deformed, on which electronic components are mounted by the apparatus for mounting electronic components of the exemplary embodiment of the present invention.

FIG. 2B shows the substrate 2, when it is transferred to the apparatus for mounting electronic components after having passed through a number of processes. The shape of the substrate 2 has changed from rectangular to trapezoidal as shown in FIG. 2B, as various parts of it have deformed at different ratios of expansion and contraction due to heat and load. As a consequence, the identification marks A, B, C and D have also been displaced from the original positions in FIG. 2A to positions A', B', C' and D' in FIG. 2B. Alphabetic ideograms in parentheses such as (x'a, y'a) etc. indicate an X coordinate value and a Y coordinate value in an optical system of the camera 11 for each of the identification marks A', B', C' and D' after the deformation. The mounting positions Mi has also been displaced by the deformation. For example, a mounting position Mi (xmi, ymi) has moved by coordinate values of Axmi and Aymi to a position M'i (xmi+Δxmi, ymi+Δymi) after the displacement. This means that the programmed data of the coordinates needs to be corrected by the values of Δxmi and Δymi when the electronic component 3 is mounted. Likewise, all of the mounting positions Mi (i=1, 2, - - -, n) need to be corrected. Here, coordinate systems before and after the displacement shall be the same coordinate system of the equipment for mounting electronic components. As a mounting position, only M'i is shown in FIG. 2B for simplicity.

Referring to FIG. 4, a structure of a control system for the apparatus for mounting electronic components is described hereinafter. A position determining unit 21 in FIG. 4 determines coordinates of the identification marks A, B, C and D based on data taken by the camera 11 that observes the identification marks A, B, C and D on the substrate 2. A coordinate data storing unit 22 stores coordinate data programmed for the mounting position of the electronic component 3 on the substrate 2 and a positional correction value of the coordinates for the mounting position. A positional correction arithmetic unit 23 computes and derives a positional correction value for each mounting position based on the coordinate data programmed for the mounting position and coordinate values of the identification marks A, B, C and D. A control unit 20 controls an operation of the entire apparatus for mounting electronic components as well as a transfer means 24 according to the coordinate data programmed for the mounting position and the positional correction value obtained by the positional correction arithmetic unit 23.

An example of an arithmetic computation of the positional correction value which is carried out by the positional correction arithmetic unit 23 is explained below for one of the mounting positions Mi (xmi, ymi) on the substrate 2. When the substrate 2 deforms in its plane configuration, the mounting position Mi and coordinate values of the position on the coordinate axes also change due to the deformation as shown in FIG. 2A and FIG. 2B. Therefore, it is essential that the transfer means 24 is operated after making a correction of the coordinates by magnitudes of the change, Δxmi and Δymi, when transferring an electronic component 3 to the mounting position Mi.

In this instance, the correction values can be obtained on the basis of the programmed data of coordinates for the mounting position Mi and data of coordinate values for any three positions on the substrate 2 before and after deformation. In other words, the positional correction values (Δxmi, Δymi) for the mounting position Mi (xmi, ymi) shown in FIG. 2A and FIG. 2B can be calculated with formulae (to be described later) using coordinate values of any three positions among the four identification marks A, B, C and D before and after deformation, which are (xa, ya), (xb, yb), (xc, yc), (x'a, y'a), (x'b, y'b) and (x'c, y'c), taking the marks A, B and C as an example, and coordinate values (xmi, ymi) of the mounting position Mi.

In this instance, the correction values obtained are applicable only in cases where the substrate 2 either expands or contracts at a uniform rate in a lengthwise direction and also at another uniform rate in a widthwise direction (the rate need not be the same rate as the lengthwise), since the calculation being made here is on an assumption that the ratios of expansion and contraction of the substrate 2 are uniform in each of an X direction and a Y direction. In reality, however, there are cases where the substrate 2 deforms irregularly from part to part at different ratios of expansion and contraction as shown in FIG. 2B.

In order to cope with such a deformation, actual positional correction values are calculated in a manner that is shown by a flow chart in FIG. 5. The flow chart of FIG. 5 is described hereinafter.

The present embodiment is to establish all combinations of any three positions among four positions of the identification marks A, B, C and D that are observed by the camera 11, which are a combination 1 (A, B and C), a combination 2 (B, C and D), a combination 3 (C, D and A) and a combination 4 (D, A, and B), as a first step (ST1 in FIG. 5). Positional correction values (Δxmi(1), Δymi(1)), (Δxmi(2), Δymi(2)), (Δxmi(3), Δymi(3)) and (Δxmi(4), Δymi(4)) for each of the four combinations 1 through 4, are then calculated in a manner as described previously (in the following steps ST2 through ST5 in FIG. 5). The appended numeral within parentheses following Δxmi and Δymi in the above values corresponds to each of the combinations 1 through 4. Formulae to be used for the calculations are shown below as (Formula 1), (Formula 2), (Formula 3) and (Formula 4).

$$\Delta x_{mi}(2) = \alpha_1 + \alpha_2 x_{mi} + \alpha_3 y_{mi} \quad \text{(Formula 1)}$$

$$\Delta y_{mi}(2) = \alpha_4 + \alpha_5 x_{mi} + \alpha_6 y_{mi}$$

$$\alpha_1 = ((x_c y_d - x_d y_c)\Delta x_b +$$

$$(x_d y_b - x_b y_d)\Delta x_c + (x_b y_c - x_c y_b)\Delta x_d)/2S$$

$$\alpha_2 = ((y_c - y_d)\Delta x_b + (y_d - y_b)\Delta x_c + (y_b - y_c)\Delta x_d)/2S$$

$$\alpha_3 = ((x_d - x_c)\Delta x_b + (x_b - x_d)\Delta x_c + (x_c - x_b)\Delta x_d)/2S$$

$$\alpha_4 = ((x_c y_d - x_d y_c)\Delta y_b +$$

-continued $$(x_d y_b - x_b y_d)\Delta y_c + (x_b y_c - x_c y_b)\Delta y_d)/2S$$

$$\alpha_5 = (x_d y_b - x_b y_d)\Delta y_c + (x_b y_c - x_c y_b)\Delta y_d)/2S$$

$$\alpha_6 = ((x_d - x_c)\Delta y_b + (x_b - x_d)\Delta y_c + (x_c - x_b)\Delta y_d)/2S$$

Here $$\Delta x_a = x'_a - x_a, \Delta x_b = x'_b - x_b, \Delta x_c = x'_c - x_c$$

$$\Delta y_a = y'_a - y_a, \Delta y_b = y'_b - y_b, \Delta y_c = y'_c - y_c$$

$$2S = ABS((x_b y_c - x_c y_b) + (x_c y_a - x_a y_c) + (x_a y_b - x_b y_a))$$

$$\Delta x_{mi}(1) = \alpha_1 + \alpha_2 x_{mi} + \alpha_3 y_{mi} \quad \text{(Formula 2)}$$

$$\Delta y_{mi}(1) = \alpha_4 + \alpha_5 x_{mi} + \alpha_6 y_{mi}$$

$$\alpha_1 = ((y_b y_c - x_c y_b)\Delta x_a +$$

$$(x_a y_c - x_c y_a)\Delta x_d + (x_c y_d - x_d y_c)\Delta x_a)/2S$$

$$\alpha_2 = ((y_b - y_c)\Delta x_a + (y_c - y_a)\Delta x_b + (y_a - y_b)\Delta x_c)/2S$$

$$\alpha_3 = ((x_c - x_b)\Delta x_a + (x_a - x_c)\Delta x_b + (x_b - x_a)\Delta x_c)/2S$$

$$\alpha_4 = ((x_b y_c - x_c y_b)\Delta y_a +$$

$$(x_c y_a - x_a y_c)\Delta y_b + (x_a y_b - x_b y_a)\Delta y_c)/2S$$

$$\alpha_5 = ((y_b - y_c)\Delta y_a + (y_c - y_a)\Delta y_b + (y_a - y_b)\Delta y_c)/2S$$

$$\alpha_6 = ((x_c - x_b)\Delta y_a + (x_a - x_c)\Delta y_b + (x_b - x_a)\Delta y_c)/2S$$

Here $$\Delta x_b = x'_b - x_b, \Delta x_c = x'_c - x_c, \Delta x_d = x'_d - x_d$$

$$\Delta y_b = y'_b - y_b, \Delta y_c = y'_c - y_c, \Delta y_d = y'_d - y_d$$

$$2S = ABS((x_c y_d - x_d y_c) + (x_d y_b - x_b y_d) + (x_b y_c - x_c y_b))$$

$$\Delta x_{mi}(3) = \alpha_1 + \alpha_2 x_{mi} + \alpha_3 y_{mi} \quad \text{(Formula 3)}$$

$$\Delta y_{mi}(3) = \alpha_4 + \alpha_5 x_{mi} + \alpha_6 y_{mi}$$

$$\alpha_1 = ((x_d y_a - x_a y_d)\Delta x_c +$$

$$(x_a y_c - x_c y_a)\Delta x_d + (x_c y_d - x_d y_c)\Delta x_a)/2S$$

$$\alpha_2 = ((y_d - y_a)\Delta x_c + (y_a - y_c)\Delta x_d + (y_c - y_d)\Delta x_a)/2S$$

$$\alpha_3 = ((x_a - x_d)\Delta x_c + (x_c - x_a)\Delta x_d + (x_d - x_c)\Delta x_a)/2S$$

$$\alpha_4 = ((x_d y_a - x_a y_d)\Delta y_c +$$

$$(x_a y_c - x_c y_a)\Delta y_d + (x_c y_d - x_d y_c)\Delta y_a)/2S$$

$$\alpha_5 = ((y_d - y_a)\Delta y_c + (y_a - y_c)\Delta y_d + (y_c - y_d)\Delta y_a)/2S$$

$$\alpha_6 = ((x_a - x_d)\Delta y_c + (x_c - x_a)\Delta y_d + (x_d - x_c)\Delta y_a)/2S$$

Here $$\Delta x_c = x'_c - x_c, \Delta x_d = x'_d - x_d, \Delta x_a = x'_a - x_a$$

$$\Delta y_c = y'_c - y_c, \Delta y_d = y'_d - y_d, \Delta y_a = y'_a - y_a$$

$$2S = ABS((x_d y_a - x_a y_d) + (x_a y_c - x_c y_a) + (x_c y_d - x_d y_c))$$

Here (Formula 4)

$$\Delta x_{mi}(4) = \alpha_1 + \alpha_2 x_{mi} + \alpha_3 y_{mi}$$

$$\Delta y_{mi}(4) = \alpha_4 + \alpha_5 x_{mi} + \alpha_6 y_{mi}$$

-continued $$\alpha_1 = ((x_a y_b - x_b y_a)\Delta x_d +$$

$$(x_b y_d - x_d y_b)\Delta x_a + (x_d y_a - x_a y_d)\Delta x_b)/2S$$

$$\alpha_2 = ((y_a - y_b)\Delta x_d + (y_b - y_d)\Delta x_a + (y_d - y_a)\Delta x_b)/2S$$

$$\alpha_3 = ((x_b - x_a)\Delta x_d + (x_d - x_b)\Delta x_a + (x_a - x_d)\Delta x_b)/2S$$

$$\alpha_4 = ((x_a y_b - x_b y_a)\Delta y_d +$$

$$(x_b y_d - x_d y_b)\Delta y_a + (x_d y_a - x_a y_d)\Delta y_b)/2S$$

$$\alpha_5 = ((y_a - y_b)\Delta y_d + (y_b - y_d)\Delta y_a + (y_d - y_a)\Delta y_b)/2S$$

$$\alpha_6 = ((x_b - x_a)\Delta y_d + (x_d - x_b)\Delta y_a + (x_a - x_d)\Delta y_b)/2S$$

$$\Delta x_d = x'_d - x_d, \Delta x_a = x'_a - x_a, \Delta x_b = x'_b - x_b$$

$$\Delta y_d = y'_d - y_d, \Delta y_a = y'_a - y_a, \Delta y_b = y'_b - y_b$$

$$2S = ABS((x_a y_b - x_b y_a) + (x_b y_d - x_d y_b) + (x_d y_a - x_a y_d))$$

Mean values of the four sets of positional correction values, as derived by the above formulae, are then obtained (a step ST6). These mean values, identified as Axma and Ayma, are the positional correction values for actual use.

Described below is the significance of obtaining the mean values of the positional correction values derived from all of the combinations of three positions of the identification marks. Selecting three specific identification marks is considered to mean that irregular deformation of a specific portion of the substrate 2 is perceived by the specific combination, in a case where the substrate 2 is irregularly deformed from part to part at different ratios of expansion and contraction. Obtaining the mean value of the positional correction values derived from all the combinations is, therefore, considered to obtain a mean value by superimposingly adding irregularities of all the specific portions.

Accordingly, a more accurate positional correction value is obtainable as compared to the prior art method, if a specific portion is expanded or contracted more than other portions, because the unevenness of that specific portion is reflected in the mean value. In general, the more positions of identification marks there are, the more accurate will be the positional correction value, since there are more combinations of three positions so as to increase the number of specific portions to be included, resulting in more accurate perception of the partial unevenness due to expansion and contraction. For practical purposes, however, positional correction values having adequate accuracy are attainable with the four identification marks A, B, C and D at each corner of the substrate 2 as they are considered to represent unevenness of the deformed substrate 2 most distinctly.

In this way, the present invention calculates positional correction values for all combinations of any three positions among the four positions of the identification marks that are provided on each corner of the rectangular substrate 2, and obtains a mean value of the four positional correction values, so as to be capable of correcting the mounting position accurately even for an ordinary irregular deformation for which correction had not been possible previously.

The apparatus for mounting electronic components constructed as above operates in a manner as described hereinafter. Referring to FIG. 1, a substrate 2 is positioned on the table 1. The camera 11 is then moved to locate above the identification marks A, B, C and D in this order over the substrate 2 by driving the moving table 5 so as to observe the individual identification marks A, B, C and D. The observed data are forwarded to the position determining unit 21 (in FIG. 4) for determining coordinate values for each of the four identification marks A, B, C and D.

Next, the coordinate values are forwarded to the positional correction arithmetic unit 23 (in FIG. 4). In this unit, a positional correction value is calculated for the mounting position M1 on the substrate 2 (FIG. 2A and FIG. 2B) based on coordinate data of the mounting position stored in the coordinate data storing unit 22 and coordinate values of the four identification marks A, B, C and D, according to the calculating method described above. The calculation is performed for all of the mounting positions Mi (i=1, 2, - - -, n), and a result of the calculation is stored in a data table shown in FIG. 6.

A mounting operation is then commenced, in which the moving table and the transfer head 12, both controlled by the control unit 20, transfer one of the electronic components 3 in the supply unit 4 to each of the mounting positions Mi. The electronic component 3 is mounted accurately at each of the mounting positions Mi even if the substrate 2 is irregularly deformed, since the coordinate values for each of the mounting positions are corrected by the positional correction values Δxmia and Δymia calculated as above, and motion of the moving head 12 is controlled according to the corrected coordinate values during this process.

The present embodiment determines the correction values for coordinates of the mounting position for each of all combinations of any three positions among the four positions of the identification marks and then obtains a mean correction value for practical use as the positional correction value, on an assumption that the substrate of approximately rectangular shape is deformed into a trapezoidal shape as shown in FIG. 2A and FIG. 2B. However, the present invention is not so limited to the calculation, in which the positional correction values are obtained for all combinations and their mean value is used as a positional correction value in practice. The purport of this is explained hereinafter by referring to FIGS. 3A and 3B. As a mounting position, only M'i is shown in FIG. 3B for simplicity.

Figure 3A:
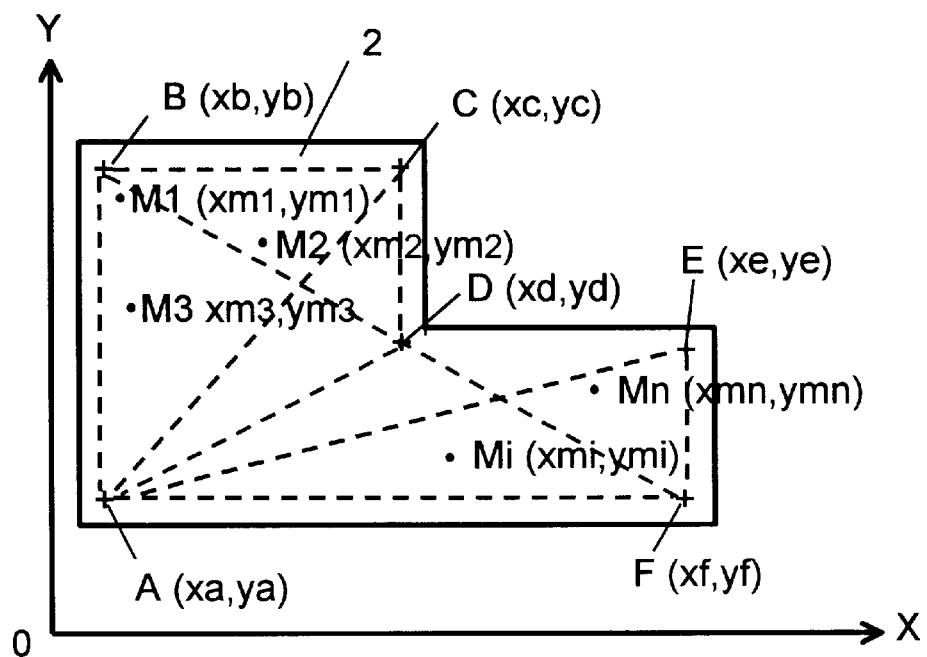
FIG. 3A is a plan view of a rectangular substrate having a cutout, before being deformed, on which electronic components are mounted by the equipment for mounting electronic components of the exemplary embodiment of the present invention.
Figure 3B:
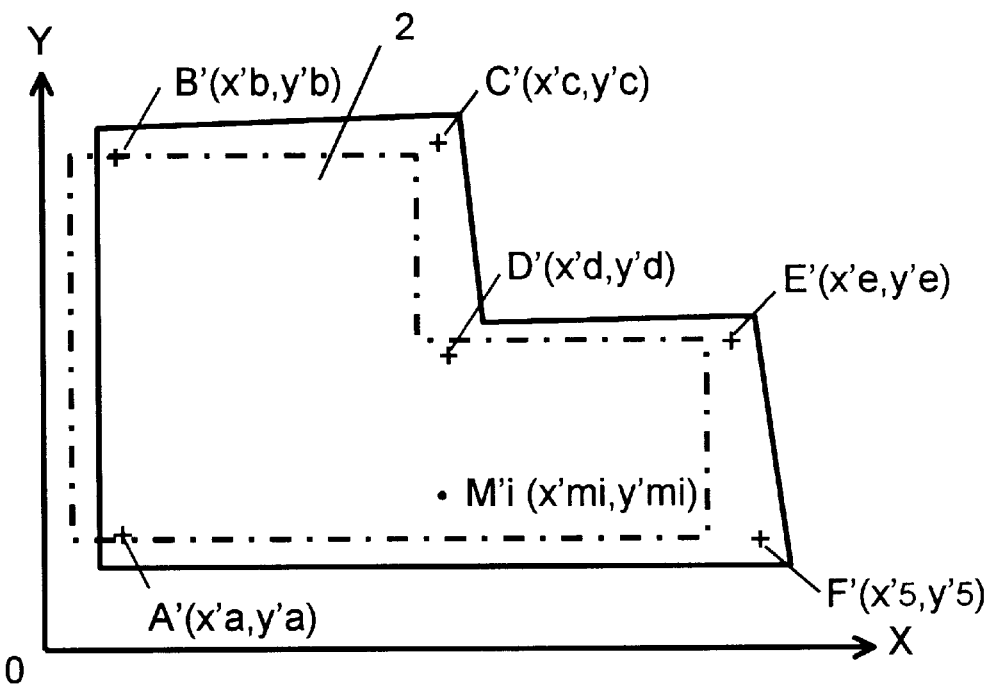
FIG. 3B is a plan view of a rectangular substrate having a cutout, after being deformed, on which electronic components are mounted by the equipment for mounting electronic components of the exemplary embodiment of the present invention.

FIGS. 3A and 3B are drawings of a substrate having a rectangular shape with a cutout, of which FIG. 3A shows the substrate without deformation and FIG. 3B shows the substrate following deformation. While the substrate is provided with identification marks at each corner in the same manner as that of FIGS. 2A and 2B, there are six identification marks A to F, since it has the cutout portion. In the same way as the exemplar of FIGS. 2A and 2B, positional correction values for mounting coordinates are obtained from coordinate data of three positions for each of a plurality of combinations of three positions selected among the six positions of the identification marks, and the mean value is used as an actual positional correction value. However, it is important to note that, generally a large error can be included in the positional correction values for mounting coordinates obtained from coordinate data of the three positions, if the mounting position is distant from a triangle formed by the three positions of the identification marks. Referring to FIGS. 3A and 3B, when positional correction values are obtained for mounting position Mi for example, a large error can result from the positional correction values of the mounting position Mi derived from three positions, if the three positions selected among the six are such combinations as (A, B and C) or (B, C and D), because both triangles formed by these combinations are far away from the mounting position Mi. On the other hand, it is obvious that the error is smaller than the above-described case if positional correction values are obtained for mounting position Mi from coordinates of three positions such as a combination of (A, E and F) or (A, D and F) because the two triangles formed by these combinations contain the mounting position Mi.

In short, the positional correction values of the mounting coordinates are to be obtained from only those combinations, in which the three positions form triangles containing or enclosing the mounting position, among all the combinations available with the six positions of the identification marks, and their mean correction value is used as the positional correction value for practical purpose. In this way, accuracy of the mean value is highly improved, and it is especially effective for a substrate having a polygonal shape. A determination as to whether or not a mounting position being sought is contained within a triangle formed by the selected three positions is carried out within the positional correction arithmetic unit 23 (in FIG. 4).

As has been described, the present invention determines positions of the identification marks formed on at least four locations on a substrate by observing them with a camera, obtains positional correction values of mounting coordinates for each of a plurality of combinations of three positions selected among the identification marks based upon the coordinate values observed on the three positions, and obtain a mean value of these positional correction values is obtained for use as an actual positional correction value. Therefore, even if the substrate is irregularly deformed in part, a positional correction value that is superimposingly added with the irregularity can be obtained, so that it is able to cope with a substrate of complicated deformation, for which an accurate correction had not been possible in the past, and the electronic components can be mounted accurately during the mounting process by making correction of positional shift of the mounting position caused by the deformation.

What is claimed is:

1. An apparatus for mounting electronic components comprising:

a transfer device for transferring an electronic component to a substrate;

a camera for observing identification marks formed on at least four positions on the substrate;

a position determining unit for detecting coordinates of the identification marks based on a result of the observations of said camera;

a coordinate data storing unit for storing data of coordinates of a mounting position at which the electronic component is to be mounted;

a positional correction arithmetic unit for calculating a correction value for coordinates of the mounting position for each of a plurality of combinations of three positions selected from among the at least four positions of the identification marks, based upon coordinate data for each of the selected three positions, and for obtaining a mean value of the correction values for use as a positional correction value; and a control unit for controlling said transfer means according to programmed data for the mounting position and the positional correction value.

2. The apparatus for mounting electronic components according to claim 1, wherein said positional correction arithmetic unit calculates a correction value for coordinates of the mounting position for each of all combinations of three positions selected from among the at least four positions of the identification marks, based upon coordinate data of each of the selected three positions, and for obtaining a mean value of all of the correction values for use as a positional correction value.

3. The apparatus for mounting electronic components according to claim 1, wherein said positional correction arithmetic unit calculates a correction value for coordinates of the mounting position for each combination of three positions, which forms a triangle containing the mounting position, based upon coordinate data of each of the selected three positions, and said positional arithmetic unit calculates a mean value of the correction values for use as a positional correction value.

4. The apparatus for mounting electronic components according to claim 1, wherein said transfer means comprises a mounting head which is movable in an X direction and in a Y direction, and said camera is mounted on said mounting head.

5. The apparatus for mounting electronic components according to claim 1, wherein the identification marks are formed at each corner of the substrate.

6. The apparatus for mounting electronic components according to claim 1, further comprising a data table for storing a result of the calculation of the positional correction value.

7. A method of mounting electronic components on a substrate having at least four identification marks, the method comprising:
 observing the identification marks with a camera and determining positional coordinates of the identification marks;
 calculating a correction value for coordinates of the mounting position for each of a plurality of combinations of three positions selected from the at least four positions of the identification marks, based upon coordinate data of the three positions; and
 obtaining a mean value of the correction values for use as a positional correction value; and
 controlling a transfer means for the electronic components by correcting a programmed data for the coordinates of the mounting position with the positional correction value.

8. The method of mounting electronic components according to claim 7, wherein the correction value for coordinates of the mounting position is calculated for each of all combinations of three positions selected among said at least four positions of identification marks, based upon coordinate data of the three positions, and a mean value of all of the correction values is obtained for use as the positional correction value.

9. The method of mounting electronic components according to claim 7, wherein the correction value for coordinates of the mounting position is calculated for each of the combinations of three positions selected from among the at least four positions of the identification marks, and each of the combinations of three positions forms a triangles that contains the mounting position, and the calculated correction value is based upon coordinate data of the selected three positions, and a mean value of the correction values is calculated for use as the positional correction value.

10. The method of mounting electronic components according to claim 7, wherein said camera observes the identification marks while being moved by said transfer means.

11. The method of mounting electronic components according to claim 7, further comprising storing the calculated positional correction value in a data table.

* * * * *